(12) United States Patent
Bhattacharya et al.

(10) Patent No.: US 8,943,830 B2
(45) Date of Patent: Feb. 3, 2015

(54) COATED POROUS METALLIC MAT

(75) Inventors: Arun K. Bhattacharya, San Diego, CA (US); Jose M. Aurrecoechea, San Diego, CA (US)

(73) Assignee: Solar Turbines Inc., San Diego, CA (US)

(*) Notice: Subject to any disclaimer, the term of this patent is extended or adjusted under 35 U.S.C. 154(b) by 335 days.

(21) Appl. No.: 13/397,961

(22) Filed: Feb. 16, 2012

(65) Prior Publication Data

US 2013/0213045 A1 Aug. 22, 2013

(51) Int. Cl.
*B32B 3/26* (2006.01)
(52) U.S. Cl.
USPC ............ 60/737; 428/304.4; 431/329
(58) Field of Classification Search
CPC .......... B32B 3/26; C23C 16/56; C23C 16/12; C23C 10/48
USPC ............ 60/734–749; 428/304.4; 148/240; 431/7, 100, 170, 326–329
See application file for complete search history.

(56) References Cited

U.S. PATENT DOCUMENTS

| | | | |
|---|---|---|---|
| 4,338,360 A † | 7/1982 | Cavanagh | |
| 4,597,734 A * | 7/1986 | McCausland et al. | 431/328 |
| 5,958,204 A † | 9/1999 | Creech | |
| 6,199,364 B1 * | 3/2001 | Kendall et al. | 60/776 |
| 6,558,810 B2 * | 5/2003 | Garbo | 428/549 |
| 6,834,504 B2 † | 12/2004 | Griffin | |
| 2006/0137333 A1 * | 6/2006 | LaBarge et al. | 60/302 |

\* cited by examiner
† cited by third party

*Primary Examiner* — J. Gregory Pickett
(74) *Attorney, Agent, or Firm* — Procopio, Cory, Hargreaves & Savitch LLP

(57) ABSTRACT

A porous metallic mat is provided. The porous metallic mat includes a plurality of fibers and a protective coating. The plurality of fibers is sintered into a mat configuration. The protective coating is provided on the porous metallic mat. The protective coating includes a diffusion aluminide configured to provide oxidation resistance to the porous metallic mat.

9 Claims, 6 Drawing Sheets

COATED POROUS METALLIC MAT

TECHNICAL FIELD

The present disclosure relates to porous metallic mats and more particularly to providing durability and reliability to fibers of the porous metallic mat.

BACKGROUND

The combustion chamber of gas turbine engines has a number of burner arrangements. U.S. Pat. No. 6,834,504 relates to increasing the stability of the lean premix combustion by increasing the distance between flame temperature and extinction limit temperature. A burner in the mixing zone is equipped with a net-like structure for the premixing of combustion air and fuel.

SUMMARY OF THE DISCLOSURE

In one aspect of the present disclosure a porous metallic mat is provided. The porous metallic mat includes a plurality of fibers and a protective coating. The plurality of fibers is sintered into a mat configuration. The protective coating is provided on the porous metallic mat. The protective coating includes a diffusion aluminide configured to provide oxidation resistance to the porous metallic mat.

In another aspect of the disclosure, a method of applying a protective coating on a porous metallic mat is provided. The method provides a powder pack at least containing aluminum or an aluminum alloy. The method immerses the porous metallic mat in the provided powder pack. The method then raises a temperature of the immersed porous metallic mat for a pre-determined time period.

Other features and aspects of this disclosure will be apparent from the following description and the accompanying drawings.

DETAILED DESCRIPTION

Figure 1:
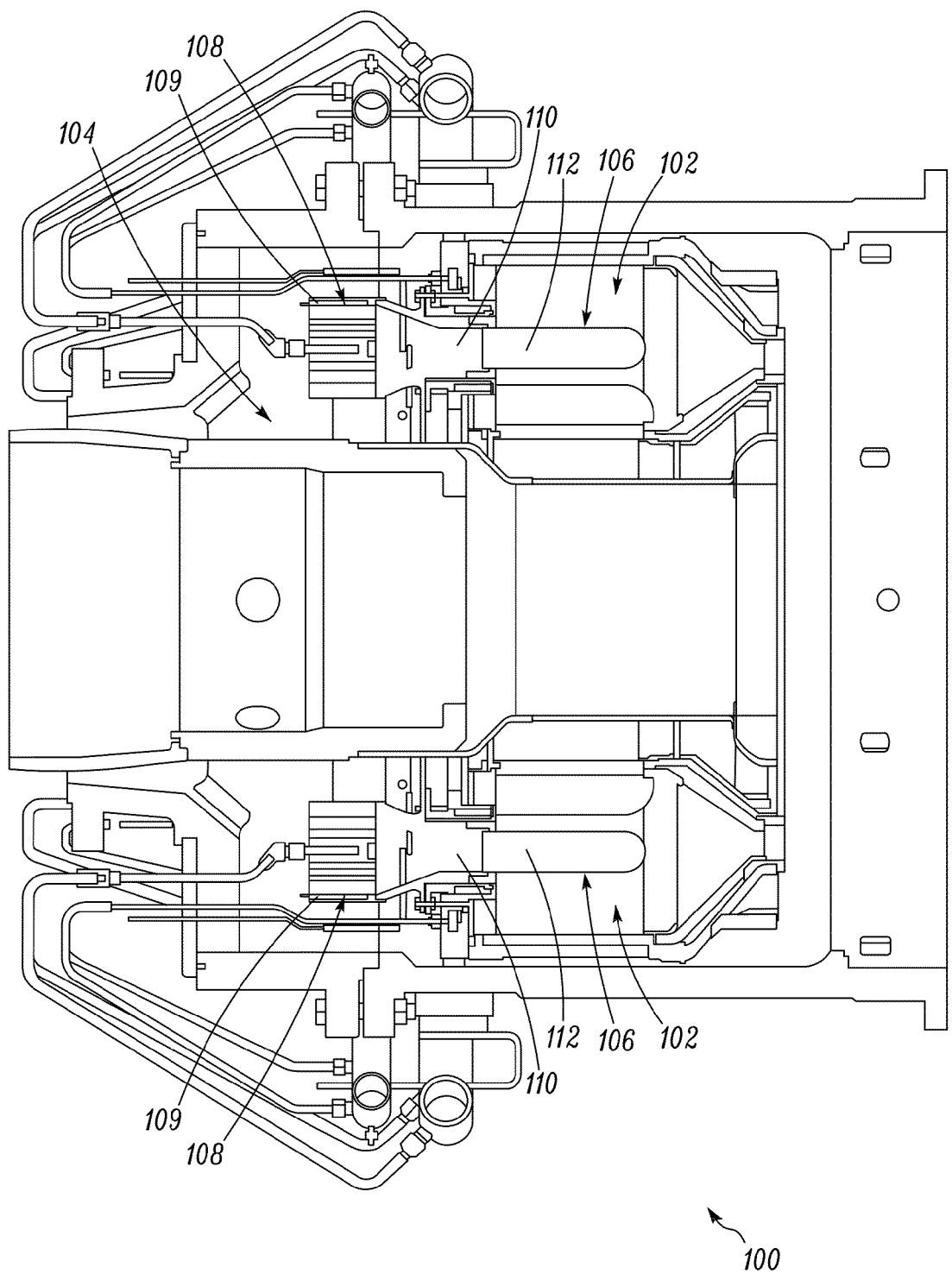
FIG. 1 is a diagrammatic view of an exemplary combustor chamber of a gas turbine engine.

FIG. 1 illustrates an exemplary combustor chamber 102 in a gas turbine 100. The combustor chamber 102 has an annular configuration. A distributor 104 is present in the gas turbine 100. The distributor 104 is a perforated metal cylinder, which provides a uniform flow to a plurality of burner assemblies 106. The uniform flow facilitates in preventing localized heating.

A fuel-air premixer 108 is located downstream of the distributor 104. The fuel-air premixer 108 may facilitate in achieving spatial fuel concentration uniformity at the burner assembly 106 in order to achieve optimal emissions. The fuel-air premixer 108 may include a plurality of small diameter tubes 109. The tubes 109 mix fuel and combustion air on a small scale to form a combustion airflow in a converging section downstream of the distributor 104.

Figure 2:
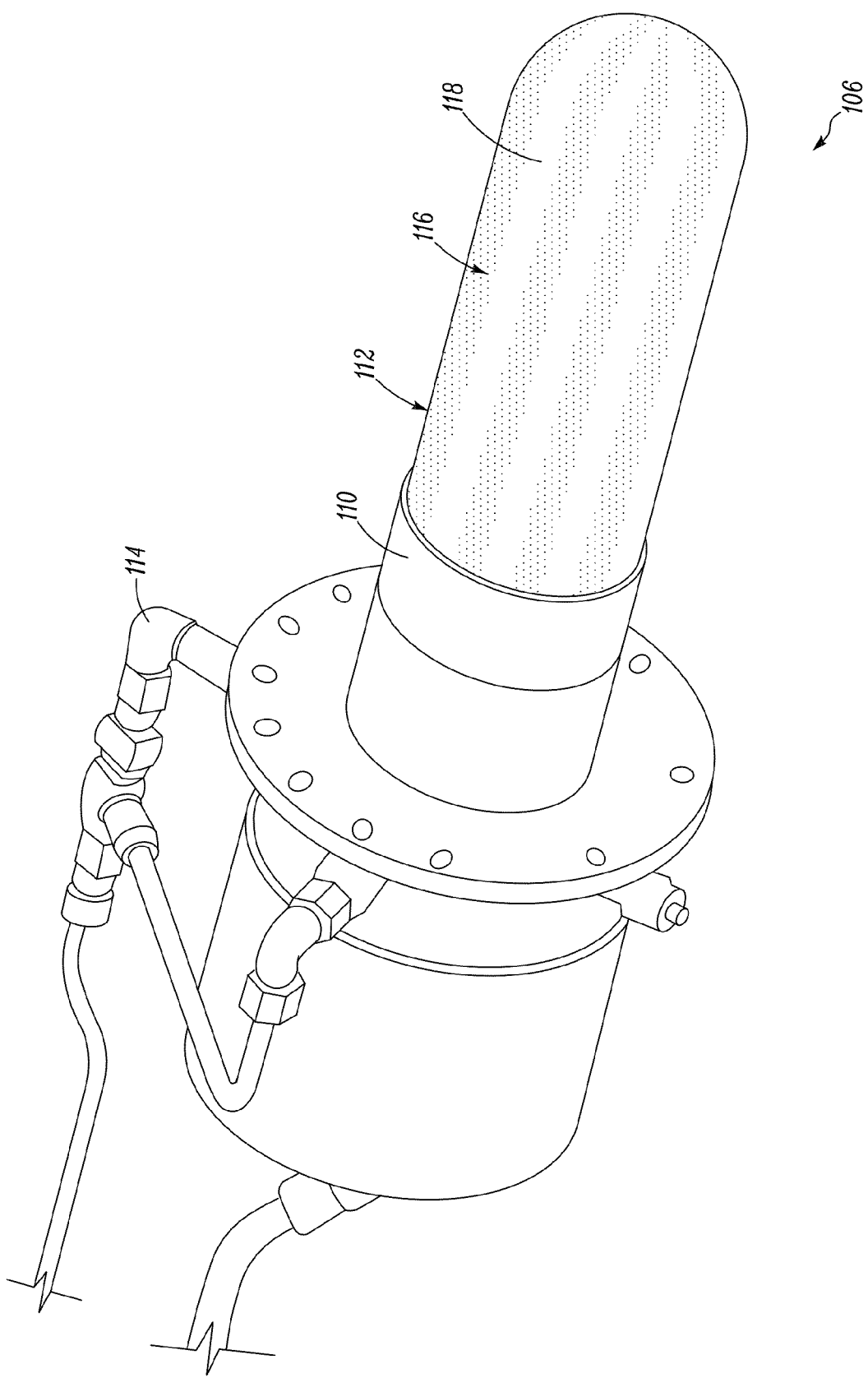
FIG. 2 is a diagrammatic view of a burner assembly in the combustor chamber.

As shown in FIG. 1, the plurality of burner assemblies 106 is radially located inside the combustor chamber 102. The burner assembly 106 may include a mounting ring 110 and a surface burner 112. FIG. 2 illustrates a solid view of the burner assembly 106. The fuel-air premixer 108 is connected to the mounting ring 110 of the burner assembly 106.

Pilot fuel may be injected via a pilot module 114 into the burner assembly 106. The fuel may react with the combustion gas to generate a stable diffusion flame, which is used during startup of the gas turbine 100. The combustion gas and air mixture may then be passed through the surface burner 112. As shown in the accompanying figures, the surface burner 112 may be selectively perforated. The selective perforations include a plurality of pores 116 extending from an inner surface to an outer surface of surface burner 112 and configured to allow flow of the combustion gas and air mixture through the surface burner 112 from the inner surface to the outer surface. The selective perforations may create an alternating pattern of high-flow and low-flow zones. This velocity gradient may enhance the diffusion flame stability and enable greater volumetric firing rates without diffusion flame lift-off.

The surface burner 112 is constructed from a porous metallic mat 118 having plurality of fibers sintered into a mat configuration. In one embodiment, the fibers may be made up of iron chromium aluminum yttrium alloy. As shown in FIG. 2, the porous metallic mat 118 may embody a three dimension structure. The porous metallic mat 118 may further include an open end at the mounting ring 110 end and a closed end at the distal end. In one embodiment, the porous metallic mat 118 may have a generally cylindrical structure with a U shaped cross-section forming the open and closed ends. A person of ordinary skill in the art will appreciate that parameters such as shape, size, length and thickness of the porous metallic mat 118 may vary.

The disclosure relates to providing the porous metallic mat 118 with a protective covering configured to provide oxidation resistance to the porous metallic mat 118. The protective coating includes diffusion aluminide.

INDUSTRIAL APPLICABILITY

The surface burner 112 may be subjected to high levels of oxidation due to elevated temperatures in the combustor chamber 102. As a result, over an extended period of time, the performance of known surface burners is compromised. Moreover, the oxidation causes the known surface burners to become brittle.

Figure 3:
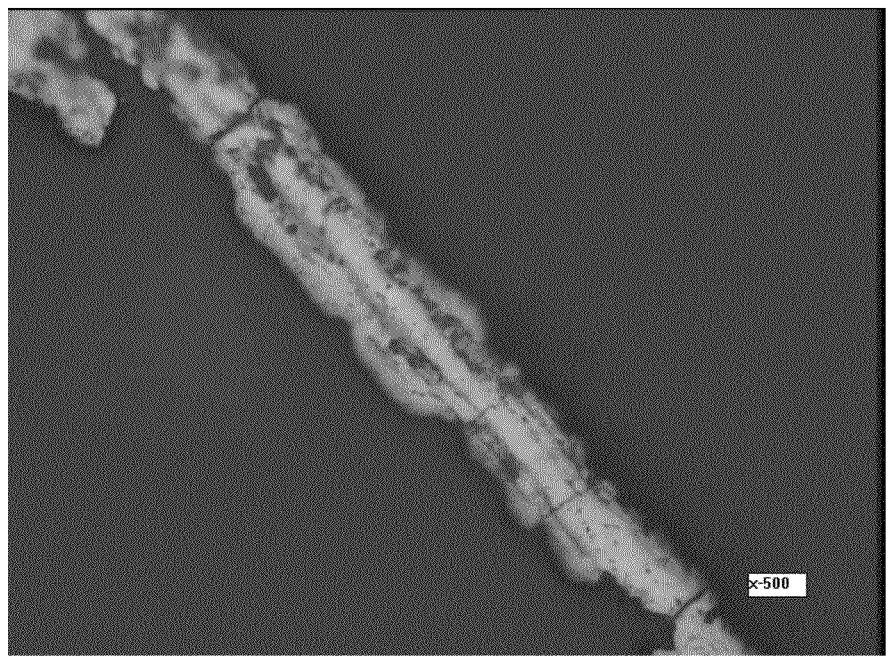
FIG. 3 is an exploded longitudinal view of oxidation behavior of a fiber without a protective coating, at very high temperature and time.
Figure 4:
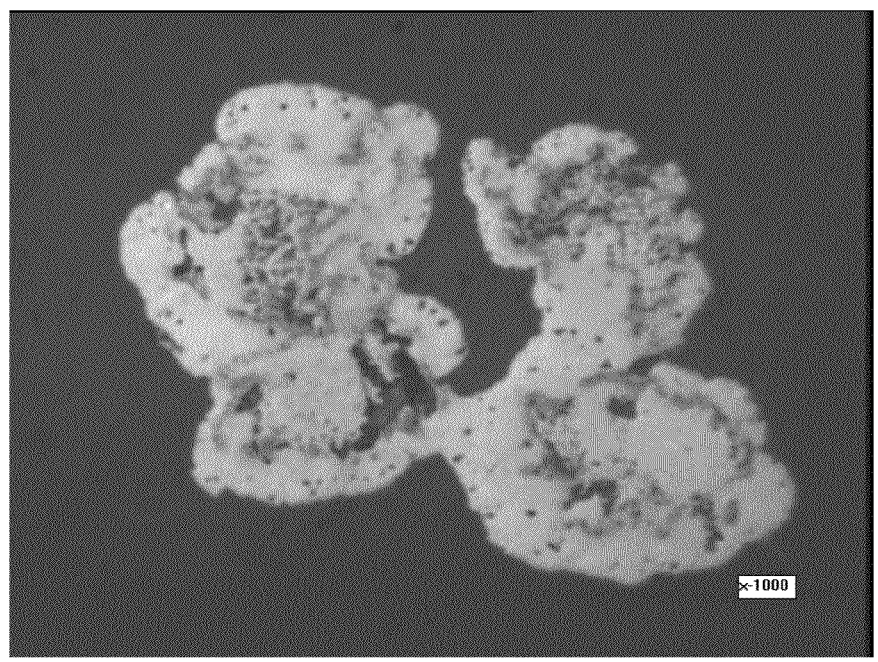
FIG. 4 is an exploded transverse view of oxidation behavior of the fiber of FIG. 3.

FIGS. 3 and 4 are exploded views of the longitudinal and cross-sectional views respectively of oxidation behavior of a fiber without having a protective coating, at a high temperature and time. Profuse oxidation is visible in the accompanied figures. As shown, a number of cracks along the length of the fibers are visible in FIG. 3, which is indicative of the failure in these fibers due to loss of strength caused by oxidation.

Figure 5:
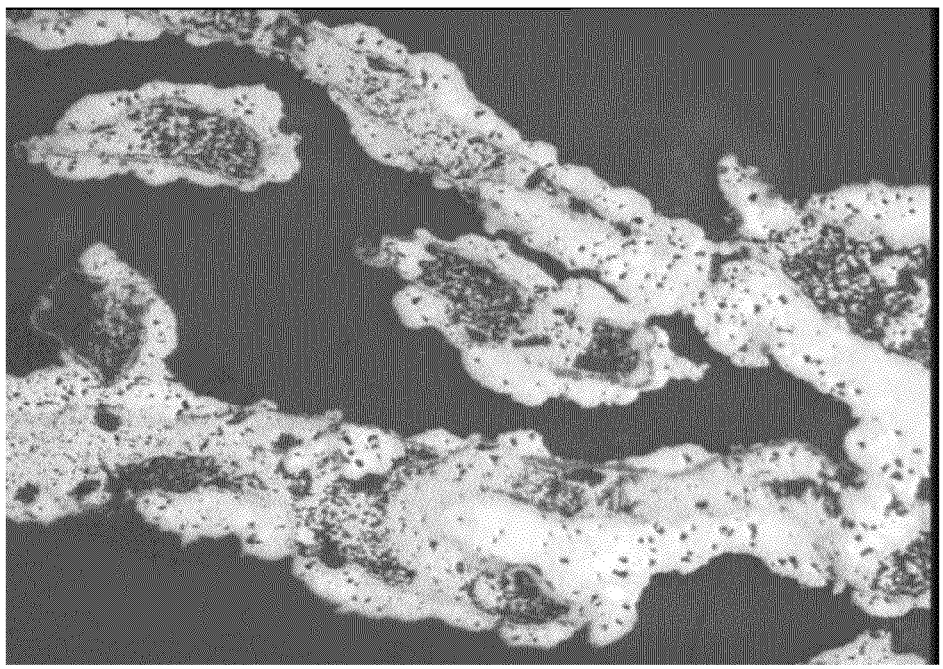
FIG. 5 is a longitudinal section showing oxidation behavior of a plurality of fibers without a protective coating.
Figure 6:
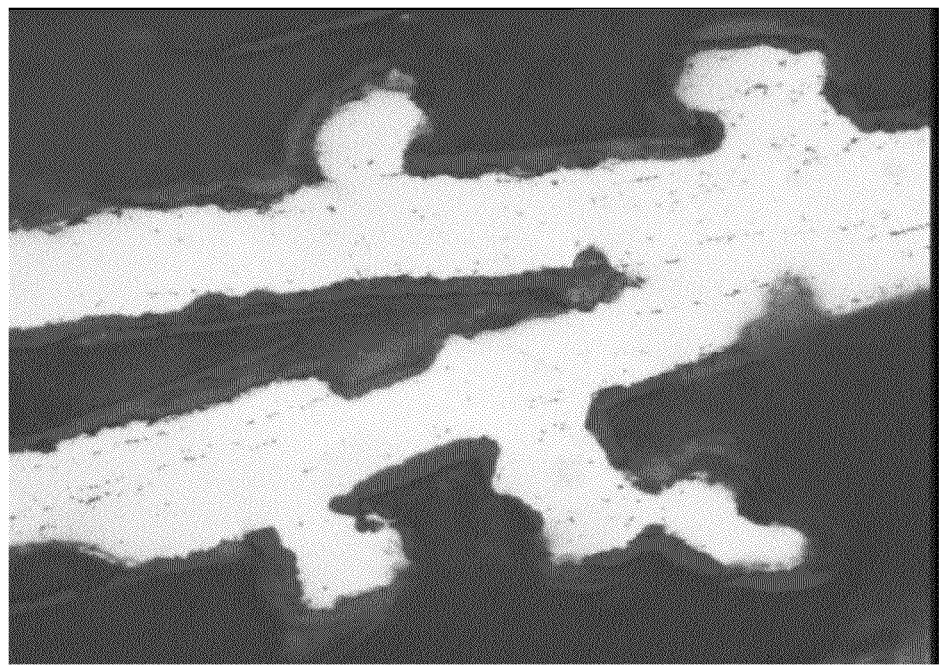
FIG. 6 is a longitudinal section showing oxidation behavior of the plurality of fibers having a protective coating.
Figure 7:
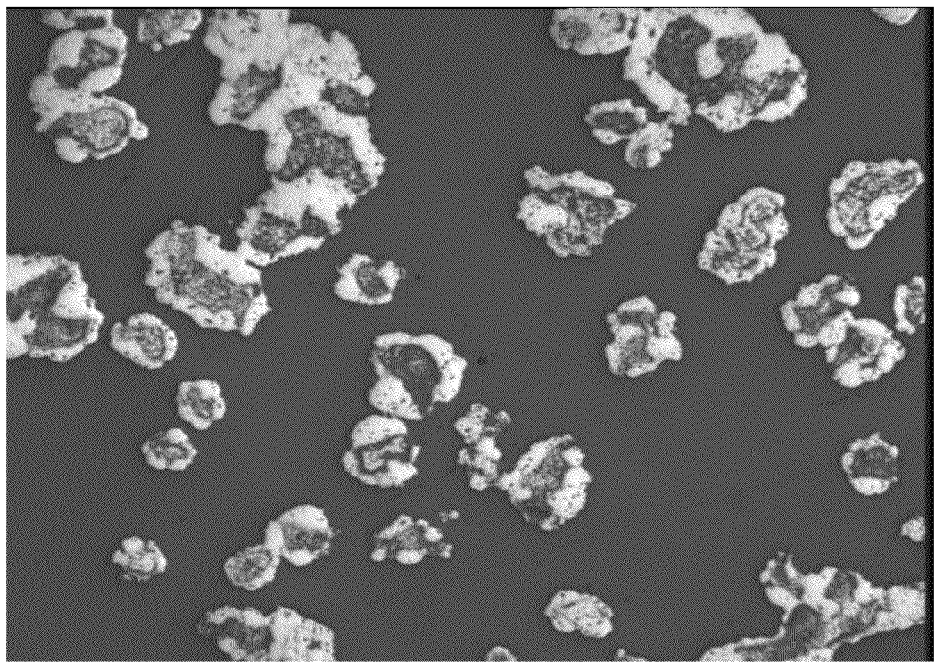
FIG. 7 is a transverse section showing oxidation behavior of the plurality of fibers shown in FIG. 5, without the protective coating.
Figure 8:
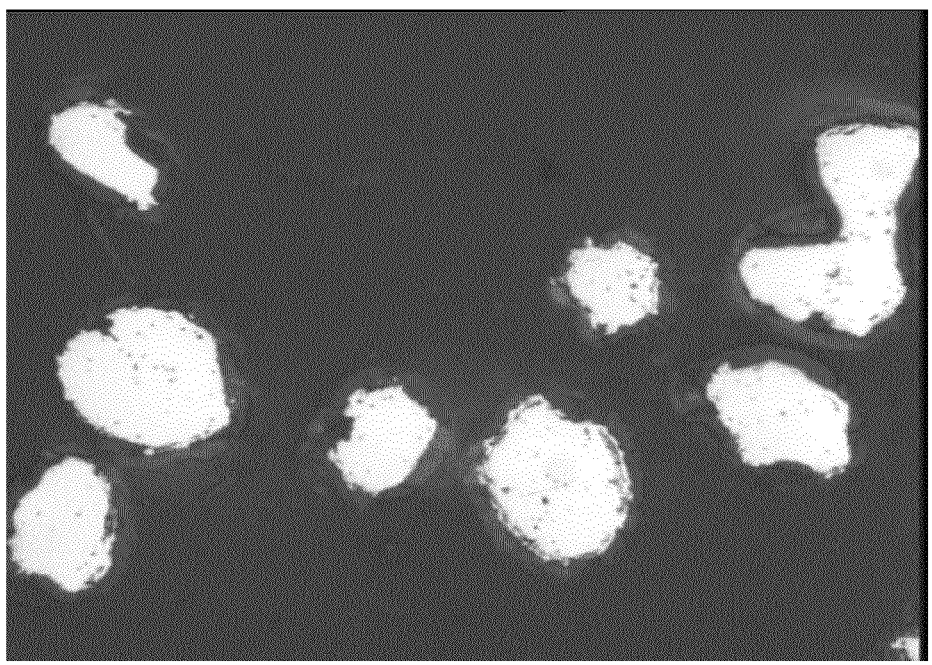
FIG. 8 is a transverse section showing oxidation behavior of the plurality of fibers shown in FIG. 6, having the protective coating.

FIGS. 5 and 7 illustrate a longitudinal and transverse oxidation behavior respectively of fibers of known surface burners without the protective coating, which are exposed to elevated temperatures over an extended period of time. Conversely, FIGS. 6 and 8 illustrate a longitudinal and transverse section of the oxidation behavior of the fibers of the porous metallic mat, which have the protective coating covering the fiber surface, when exposed to the same temperature and time duration. The comparison between FIGS. 5 and 6 and FIGS. 7 and 8 shows the improvement in oxidation resistance provided to the fibers of the porous metallic mat 118 by the protective coating on the fiber surfaces as seen in FIGS. 6 and 8.

The disclosure, as described above, provides oxidation resistance to the porous metallic mat 118. The diffusion aluminide protects the porous metallic mat 118 from rapid oxidation at the elevated temperatures. In another embodiment, the protective coating imparts increased stiffness to the porous metallic mat 118 to sustain mechanical vibrations. Hence, the protective coating may enhance the durability and reliability of the porous metallic mat 118.

Figure 9:
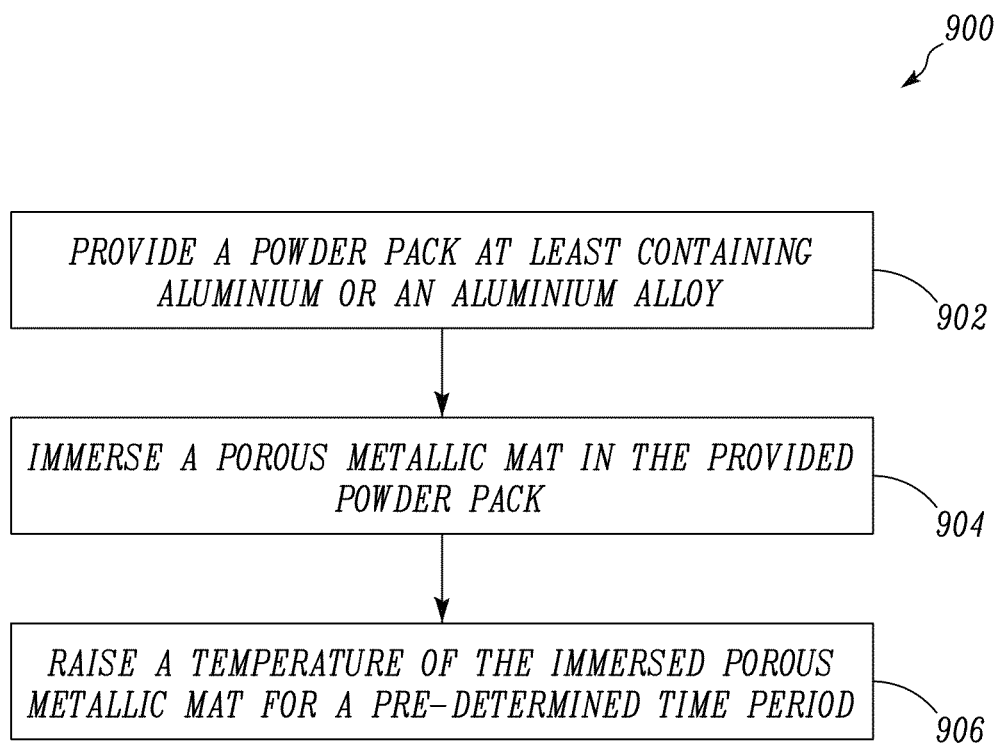
FIG. 9 is a process of applying the protective coating on the porous metallic mat.

A method of applying the protective coating to the porous metallic mat 118 will be described in detail in connection with FIG. 9. At step 902, a powder pack including aluminum or an aluminum alloy is provided. In one embodiment, the powder pack may also contain a halide and an inert filler like aluminum oxide. The aluminum may act as the donor and the halide as an activator.

Subsequently, at step 904, the porous metallic mat 118 is immersed in the provided powder pack. At step 906, a temperature of the immersed porous metallic mat is raised for a pre-determined time period. The method 900 may be considered to be a chemical vapor deposition process resulting from appropriate chemical reaction. The aluminum element to be deposited is transferred to the fibers of the porous metallic mat 118 by means of a volatile metal halide and then diffused into the base alloy of the fibers.

A person of ordinary skill in the art will appreciate that the porous metallic mat 118 having the protective coating is described above in connection with the surface burner 112 as an exemplary basis. The disclosure may also relate to other applications of the porous metallic mat 118 requiring improved oxidation resistance, which are not described herein.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A porous metallic mat comprising:
   a plurality of fibers sintered into a mat configuration forming a surface burner for a combustion chamber of a gas turbine engine, the surface burner having an outer burner surface and an inner surface and a plurality of pores configured to allow flow of a combustion mixture through the surface burner from the inner surface to the outer burner surface; and
   a protective coating provided on the fibers of the porous metallic mat, the protective coating extending over the inner surface and outer burner surface of the porous metallic mat and including a diffusion aluminide configured to provide oxidation resistance to the porous metallic mat.

2. The porous metallic mat of claim 1, wherein the fibers are made up of iron chromium aluminum yttrium alloy.

3. The porous metallic mat of claim 1, wherein the protective coating imparts increased stiffness to the porous metallic mat.

4. The porous metallic mat of claim 1, wherein a plurality of pores on the porous metallic mat are configured to allow flow of a combustion gas and air mixture through the surface burner.

5. The porous metallic mat of claim 1, wherein the porous metallic mat has a cylindrical structure having one open end attached to a mounting ring of the surface burner and a second closed end.

6. A burner assembly comprising:
   a mounting ring; and
   a surface burner for a combustion chamber of a gas turbine engine, the surface burner having an outer burner surface and an inner surface and selective perforations, the surface burner configured to receive a combustion gas and air mixture and the selective perforations configured to allow flow of the combustion gas and air mixture from the inner surface to the outer burner surface, wherein the surface burner is constructed from a porous metallic mat, the porous metallic mat including:
      a plurality of fibers sintered into a mat configuration; and
      a protective coating provided on fibers forming the porous metallic mat, the protective coating extending over the inner surface and outer burner surface of the porous metallic mat and including a diffusion aluminide configured to provide an oxidation resistance for the porous metallic mat.

7. The burner assembly of claim 6, wherein the fibers are made of iron chromium aluminum yttrium alloy.

8. The burner assembly of claim 6, wherein the protective coating imparts increased stiffness to the porous metallic mat.

9. The burner assembly of claim 6, wherein the porous metallic mat has a cylindrical structure having one open end attached to the mounting ring and a second closed end.

* * * * *